United States Patent
Inano et al.

(10) Patent No.: US 10,356,958 B2
(45) Date of Patent: Jul. 16, 2019

(54) IMMERSION COOLING APPARATUS

(71) Applicant: FUJITSU LIMITED, Kawasaki-shi, Kanagawa (JP)

(72) Inventors: Satoshi Inano, Minoh (JP); Minoru Ishinabe, Atsugi (JP); Yukiko Wakino, Sagamihara (JP); Hiroyuki Fukuda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/114,934

(22) Filed: Aug. 28, 2018

(65) Prior Publication Data

US 2019/0082556 A1    Mar. 14, 2019

(30) Foreign Application Priority Data

Sep. 11, 2017  (JP) .................................. 2017-174188

(51) Int. Cl.
 *H05K 7/20* (2006.01)

(52) U.S. Cl.
 CPC ....... *H05K 7/2079* (2013.01); *H05K 7/20236* (2013.01); *H05K 7/20263* (2013.01); *H05K 7/20272* (2013.01)

(58) Field of Classification Search
 CPC .. H05K 7/20236; H05K 7/2079; H05K 7/203; H05K 7/20809; H05K 7/20272; H05K 7/20781; H05K 7/20818; H05K 7/20281; H05K 7/20772; H05K 7/20836; H05K 7/20763; H05K 7/20263; H05K 7/20327; H05K 7/20927; H05K 5/06; H05K 7/20872; G06F 1/20; G06F 2200/201; G06F 1/206; H01L 23/473; H01L 23/44; H01L 21/67109; F28D 15/0266; F28D 15/06; F24H 4/04; F28F 2280/10; F28F 13/125

See application file for complete search history.

(56) References Cited

U.S. PATENT DOCUMENTS

| 2013/0278369 A1* | 10/2013 | Shepard ................... H01F 5/04 336/58 |
| 2014/0218858 A1* | 8/2014 | Shelnutt .................. G06F 1/206 361/679.31 |

FOREIGN PATENT DOCUMENTS

| JP | 4-372159 | 12/1992 |
| JP | 2011-518395 | 6/2011 |
| WO | 2009/131810 | 10/2009 |

* cited by examiner

*Primary Examiner* — Mandeep S Buttar
(74) *Attorney, Agent, or Firm* — Fujitsu Patent Center (57) ABSTRACT

An immersion cooling apparatus includes an immersion tank in which an electronic device is disposed and in which a secondary refrigerant is stored, the electronic device being dipped into and cooled down by the secondary refrigerant, a housing in which the immersion tank is disposed and in which a primary refrigerant is stored, the immersion tank being dipped into and cooled down by the primary refrigerant, and a driver that rotates the immersion tank, wherein the immersion tank being rotatably attached to an interior of the housing, the immersion tank having an inner circumferential surface and an outer circumferential surface, the inner circumferential surface being positioned facing the electronic device, the outer circumferential surface being positioned on an opposite side of the inner circumferential surface, each of the inner circumferential surface and the outer circumferential surface having a plurality of projections.

5 Claims, 7 Drawing Sheets

IMMERSION COOLING APPARATUS

CROSS-REFERENCE TO RELATED APPLICATION

This application is based upon and claims the benefit of priority of the prior Japanese Patent Application No. 2017-174188, filed on Sep. 11, 2017, the entire contents of which are incorporated herein by reference.

FIELD

The embodiments discussed herein are related to immersion cooling apparatuses.

BACKGROUND

A data center is a facility that includes a server, information and communication technology (ICT) devices, a cooling device, and other electronic devices. These devices are installed, operated, and maintained preferably at low costs. For that purpose, various approaches, such as integration of the electronic devices, downsizing and optimizing of the cooling device, and efficient cooling of the electronic devices, have been made. For example, a cooling system in which electronic devices are dipped into an immersion tank cooling liquid stored in an immersion tank.

In a cooling system as described above, since the immersion tank cooling liquid in the immersion tank warms up due to heat generated by the electronic devices, it is supplied to a cooling tower or a heat exchanger by a cooling liquid pump. Then, the immersion tank cooling liquid exchanges heat with a primary cooling system refrigerant therein and is thereby cooled down. This immersion tank cooling liquid is returned to the immersion tank and used to cool down the electronic devices again.

In the above immersion cooling system, the cooling liquid pump, the heat exchanger, a pipe, and other components are typically dedicated for the immersion tank cooling liquid. In general, such special components are more expensive than ordinary components used for water. Furthermore, the immersion tank cooling liquid pump and the heat exchanger are usually installed near the immersion tank. Therefore, enough spaces to install the immersion tank cooling liquid pump and the heat exchanger have to be reserved inside the room. For this reason, this immersion cooling system may involve a high installation cost.

The following is a reference document.
[Document 1] Japanese Laid-open Patent Publication No. 04-372159.

SUMMARY

According to an aspect of the invention, an immersion cooling apparatus includes an immersion tank in which an electronic device is disposed and in which a secondary refrigerant is stored, the electronic device being dipped into and cooled down by the secondary refrigerant, a housing in which the immersion tank is disposed and in which a primary refrigerant is stored, the immersion tank being dipped into and cooled down by the primary refrigerant, and a driver that rotates the immersion tank, wherein the immersion tank being rotatably attached to an interior of the housing, the immersion tank having an inner circumferential surface and an outer circumferential surface, the inner circumferential surface being positioned facing the electronic device, the outer circumferential surface being positioned on an opposite side of the inner circumferential surface, each of the inner circumferential surface and the outer circumferential surface having a plurality of projections.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Some embodiments will be described below in detail, with reference to the accompanying drawings. In the description, identical or similar constituent elements are given the same reference numeral and illustrated on different scales as appropriate for the purpose of better understanding.

To help understand an immersion cooling apparatus in the embodiment and an immersion cooling system equipped with this immersion cooling apparatus, first, a description will be given of immersion cooling systems in first and second comparative techniques, with reference to FIGS. 1 and 2.

First, an immersion cooling system 101 in a first comparative technique will be described with reference to FIG. 1. FIG. 1 illustrates a configuration of the immersion cooling system 101. The immersion cooling system 101 includes an immersion tank 112 and a cooling tower 120. The immersion tank 112 stores an immersion tank cooling liquid 117 used to cool down a plurality of ICT devices 113. The cooling tower 120 cools down the immersion tank cooling liquid 117. For example, the immersion tank cooling liquid 117 may be Fluorinert (registered trademark) produced by 3M Company. The immersion tank 112 is provided with an immersion tank cooling liquid pipe 131 that is connected at both ends to the immersion tank 112 and extends to the interior of the cooling tower 120. The ICT devices 113 are held on mounting rails 114 and dipped into the immersion tank cooling liquid 117. The immersion tank cooling liquid 117 is circulated through the immersion tank cooling liquid pipe 131 by an immersion tank cooling liquid pump 121. Each ICT device 113 is connected to a cable or other connecting tool, for example, which extends to the outside of the immersion tank 112 along a corresponding mounting rail 114 and via a cable hole and is connected to an external device. The immersion tank cooling liquid 117 in the immersion tank cooling liquid 117 warms up to 45 degrees Centigrade or below due to heat generated by the ICT devices 113. Therefore, the warm immersion tank cooling liquid 117 is supplied by the immersion tank cooling liquid pump 121 to the cooling tower 120 via the immersion tank cooling liquid pipe 131. Then, water 116 is sprayed into the immersion tank cooling liquid 117, with a fan 132 blowing air thereto. The immersion tank cooling liquid 117 is thereby cooled down to 35 degrees Centigrade or below and then returned to the immersion tank 112. The cooling tower 120 employs a closed cooling system with water spray and air blow. More specifically, the immersion tank cooling liquid 117 is supplied to the cooling tower 120 via the immersion tank cooling liquid pipe 131 and is cooled down by the water spray and external air that the fan 132 blows in the direction denoted by an arrow A in FIG. 1. Then, the air that has been used to cool down the immersion tank cooling liquid 117 is discharged to the outside in the direction denoted by an arrow B in FIG. 1. The water 116 that has been used for the cool-down is collected into a water pipe 130 by a water pump 133 and then is reused.

As described above, the cooling tower 120 directly cools down the immersion tank cooling liquid 117 by using the water spray and the air blow. Thus, the cooling tower 120 is provided with no devices, such as a tiller, a cooling water pump, and a heat exchanger, used for a primary cooling system refrigerant. However, if the immersion tank cooling liquid pump 121 fails to circulate the immersion tank cooling liquid 117 properly, the immersion tank cooling liquid 117 in the immersion tank 112 is not sufficiently cooled down, thus causing a rapid temperature rise of the ICT devices 113. Eventually, the ICT system equipped with the ICT devices 113 may halt. Likewise, if the cooling tower 120 does not operate properly due to a trouble with the water pump 133, for example, the immersion tank cooling liquid 117 is not sufficiently cooled down. Eventually, the ICT system equipped with the ICT devices 113 may halt. Furthermore, if the cooling tower 120 is installed outside and away from the room in which the immersion tank 112 is installed, the immersion tank cooling liquid pipe 131 connecting the cooling tower 120 and the immersion tank 112 inevitably becomes long, in which case an increasing amount of the immersion tank cooling liquid 117, which is typically expensive, has to be used. Moreover, the immersion tank cooling liquid pump 121, the cooling tower 120, and the immersion tank cooling liquid pipe 131 are dedicated for the immersion tank cooling liquid 117 such as Fluorinert (registered trademark). For this reason, the immersion cooling system 101 may involve a high installation cost.

Second, an immersion cooling system 201 in a second comparative technique will be described with reference to FIG. 2. FIG. 2 illustrates a configuration of the immersion cooling system 201. The immersion cooling system 201 is similar to the foregoing immersion cooling system 101 in FIG. 1, in cooling down a plurality of ICT devices 213 by using an immersion tank cooling liquid 217. The ICT devices 213 are fixed to the immersion tank 212 through mounting rails 214 and dipped into the immersion tank cooling liquid 217. Since the immersion tank cooling liquid 217 warms up due to heat of the ICT devices 213 in the immersion tank 212, the immersion tank cooling liquid 217 is supplied to a heat exchanger 202 and exchanges heat with a primary cooling system refrigerant 216 therein. As a result, the heat is removed from the immersion tank cooling liquid 217 and discharged in the direction denoted by an arrow B in FIG. 2, so that the immersion tank cooling liquid 217 is cooled down. Then, the immersion tank cooling liquid 217 is returned to the immersion tank 212 via an immersion tank cooling liquid pipe 231. The heat exchanger 202 is connected to a tiller 203 via a primary refrigerant pipe 230. The primary cooling system refrigerant 216 that has warmed up as a result of the heat exchange is cooled down by external air blown by a compressor 232 in the tiller 203. Further, the heat that has been removed from the primary cooling system refrigerant 216 is discharged in the direction denoted by an arrow A. Then, the primary cooling system refrigerant 216 is supplied to the heat exchanger 202 and exchanges heat with the immersion tank cooling liquid 217 again. The heat exchanger 202 is disposed near the immersion tank 212, so that the immersion tank cooling liquid pipe 231 connecting the heat exchanger 202 and the immersion tank 212 becomes short. Thus, the immersion cooling system 201 does not have to use a large amount of immersion tank cooling liquid 217, thereby suppressing a cost increase.

Figure 1:
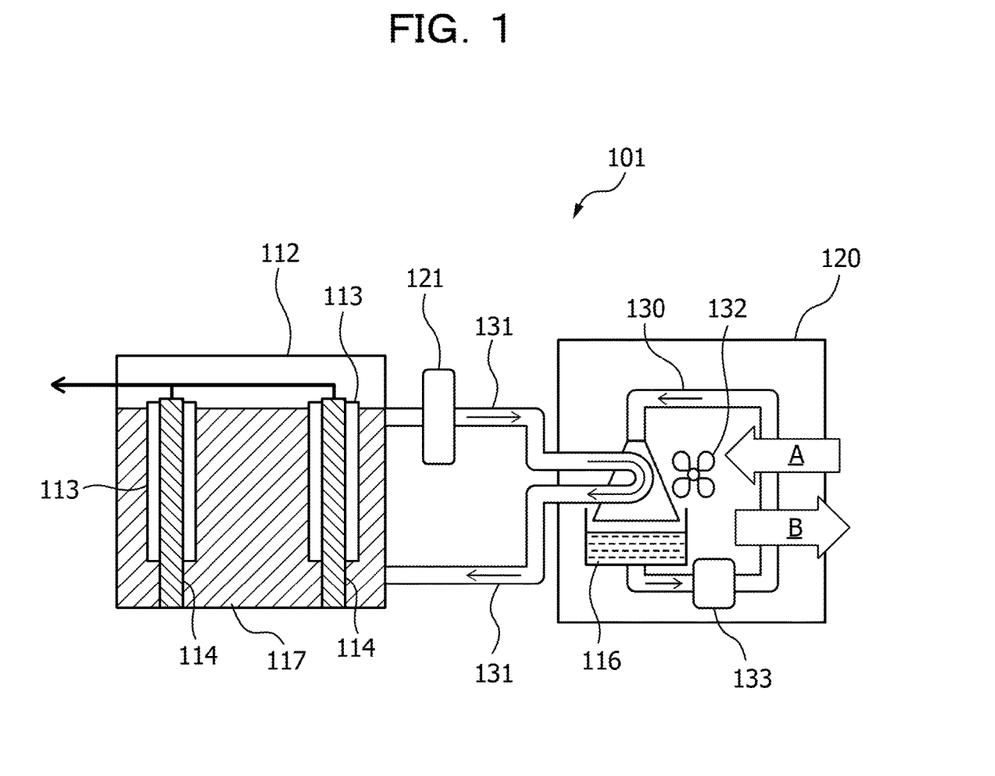
FIG. 1 illustrates a configuration of an immersion cooling system in a first comparative technique.
Figure 2:
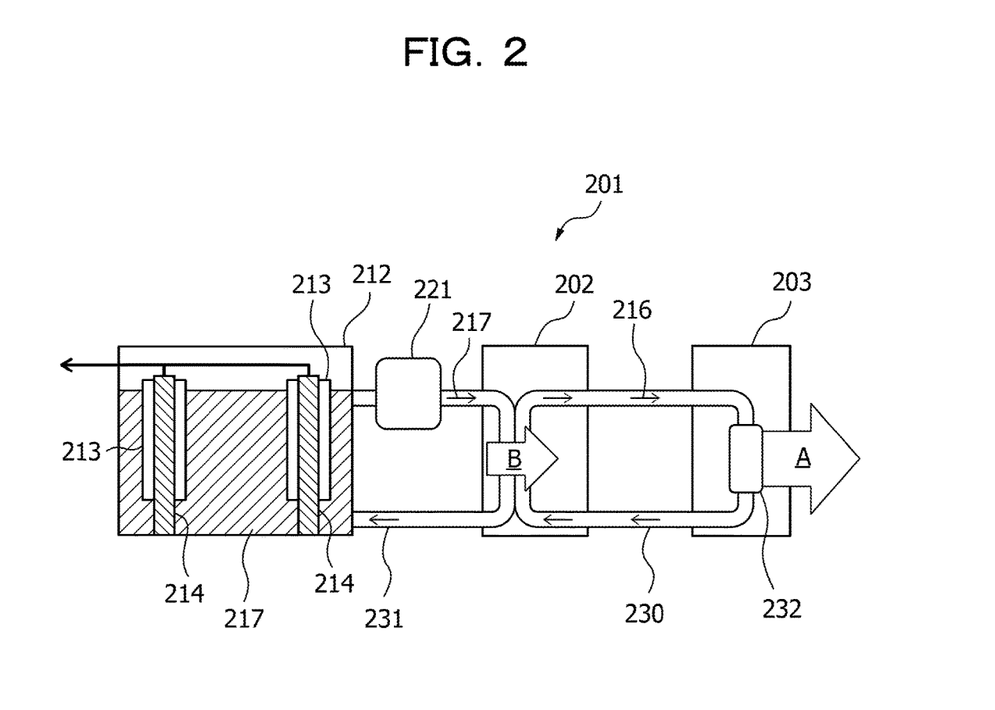
FIG. 2 illustrates a configuration of an immersion cooling system in a second comparative technique.

Similar to the foregoing immersion cooling system 101 illustrated in FIG. 1, however, if an immersion tank cooling liquid pump 221 fails to circulate the immersion tank cooling liquid 217 properly, the immersion tank cooling liquid 217 in the immersion tank 212 is not sufficiently cooled down, thus causing a rapid temperature rise of the ICT devices 213. Eventually, the ICT system equipped with the ICT devices 213 may halt. Likewise, if the tiller 203 fails to operate properly, the heat exchange is not performed. The immersion tank cooling liquid 217 that has not been cooled down in the cooling liquid pipe 231 causes a temperature rise of the ICT device 213 rapidly. Eventually, the ICT system equipped with the ICT devices 213 may halt. Moreover, the immersion tank cooling liquid pump 221, the heat exchanger 202, and the immersion tank cooling liquid pipe 231 are dedicated for the immersion tank cooling liquid 217. In addition, the immersion tank cooling liquid pump 221 and the heat exchanger 202 are installed near the immersion tank 212 inside the room, so that the immersion cooling system 101 occupies a large space inside the room. For this reason, the immersion cooling system 201 may involve a high installation cost.

An immersion cooling apparatus in the embodiment includes an immersion tank in which an electronic device such as an ICT device is disposed and a secondary refrigerant is stored. This immersion tank is rotatable inside a housing and has an inner circumferential surface and an outer circumferential surface on which projections are formed. When the immersion tank rotates, heat of the secondary refrigerant is transferred to a primary refrigerant. This configuration does not have to be provided with a pump that circulates the secondary refrigerant and a pipe through which the secondary refrigerant flows. With reference to FIGS. 3A to 7, a detailed description will be given below of an immersion cooling apparatus 10 in the embodiment and an immersion cooling system 1 equipped with the immersion cooling apparatus 10.

A primary cooling system refrigerant, which may be water, is cooled directly by external air, for example. Herein, this primary cooling system refrigerant may be referred to as the "primary refrigerant". An immersion tank cooling liquid is cooled down by the primary refrigerant. This immersion tank cooling liquid has a lower electric conductivity than that of the primary cooling system refrigerant and thus is able to directly cool down the electronic device such as the ICT device. The immersion tank cooling liquid may be oil such as poly-alpha-olefin-based synthetic oil or fluorine-based inert fluid such as Fluorinert (registered trademark). Herein, the immersion tank cooling liquid may be referred to as the "secondary refrigerant".

Figure 3A:
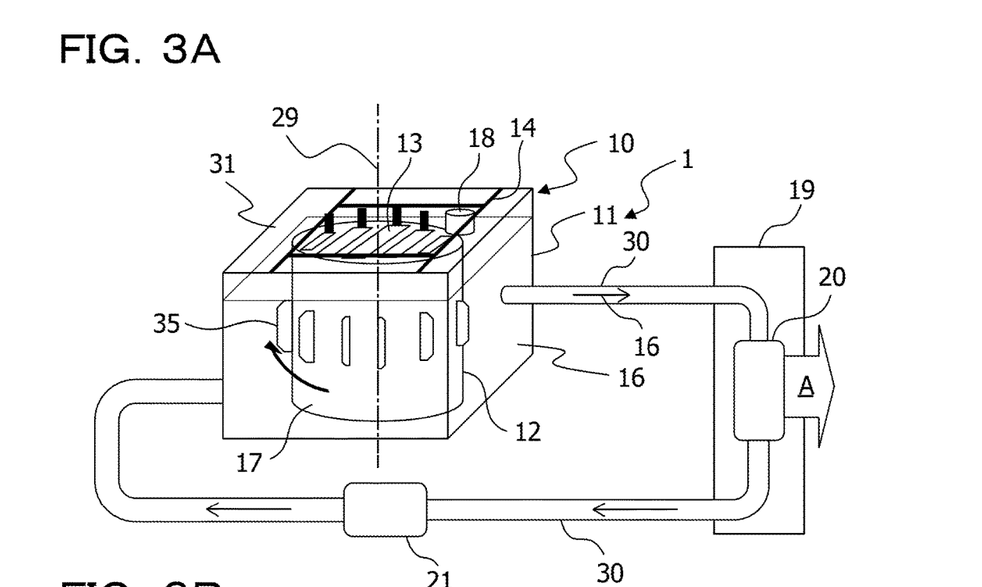
FIG. 3A illustrates a configuration of an immersion cooling system equipped with an immersion cooling apparatus in the embodiment in which a plurality of electronic devices are disposed in an immersion tank.
Figure 3B:
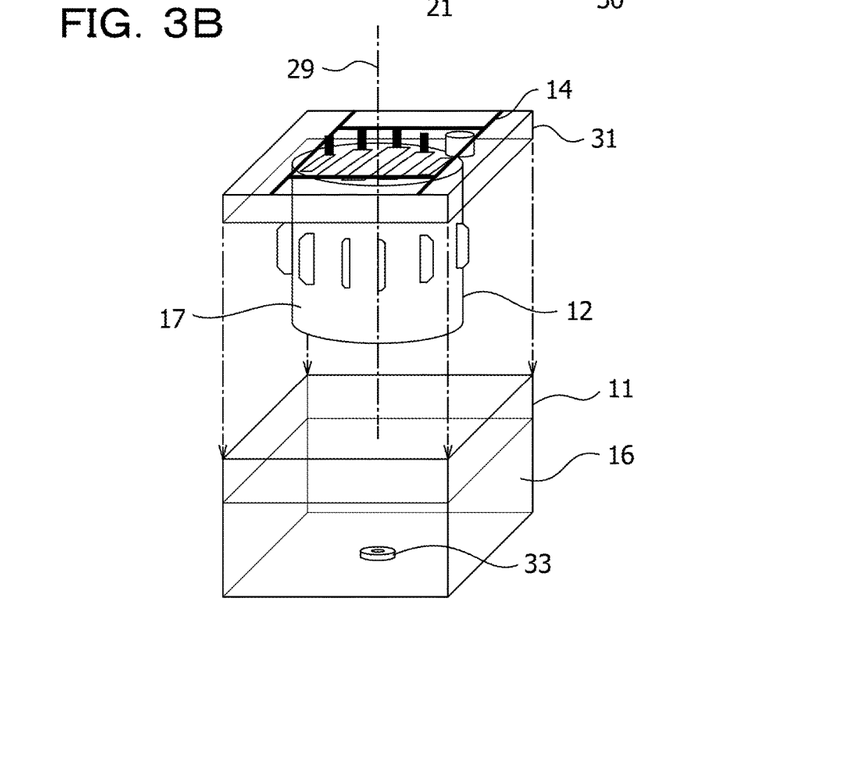
FIG. 3B illustrates the immersion cooling apparatus in perspective.
Figure 4A:
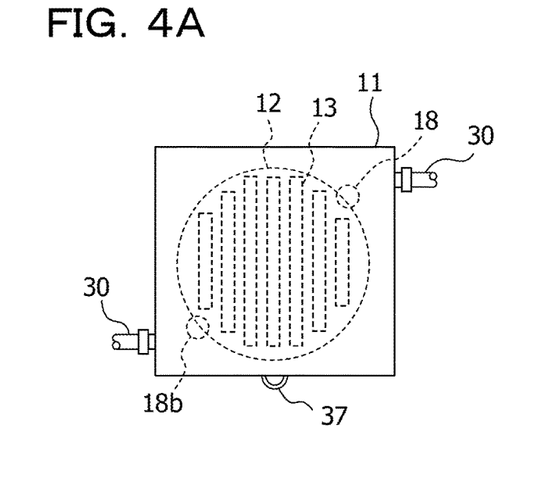
FIG. 4A is a top view of the immersion cooling apparatus.
Figure 4B:
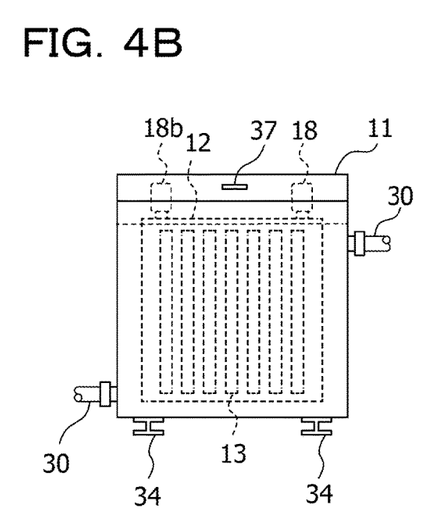
FIG. 4B is a front view of the immersion cooling apparatus.
Figure 4C:
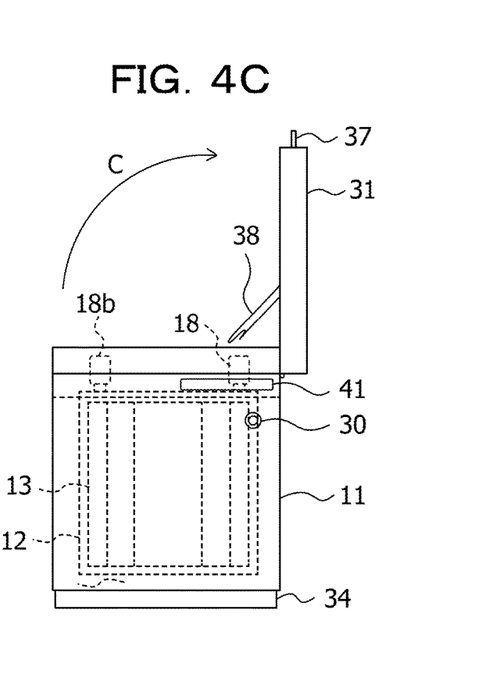
FIG. 4C is a side view of the immersion cooling apparatus.

FIG. 3A illustrates a configuration of the immersion cooling system 1 equipped with the immersion cooling apparatus 10 in this embodiment. FIG. 3B illustrates the immersion cooling apparatus 10 in perspective. The immersion cooling system 1 cools down a plurality of ICT devices 13, which may be an example of electronic devices. The immersion cooling system 1 includes the immersion cooling apparatus 10 and a tiller 19; the tiller 19 cools down a primary cooling system refrigerant 16 that has been discharged from the immersion cooling apparatus 10. The primary cooling system refrigerant 16 may be an example of the primary refrigerant. The immersion cooling system 1 includes: a primary refrigerant pipe 30 through which the primary cooling system refrigerant 16 flows; and a refrigerant pump 21 that circulates the primary cooling system refrigerant 16. The primary refrigerant pipe 30 is connected at both ends to the immersion cooling apparatus 10 and extends to the tiller 19.

Figure 6A:
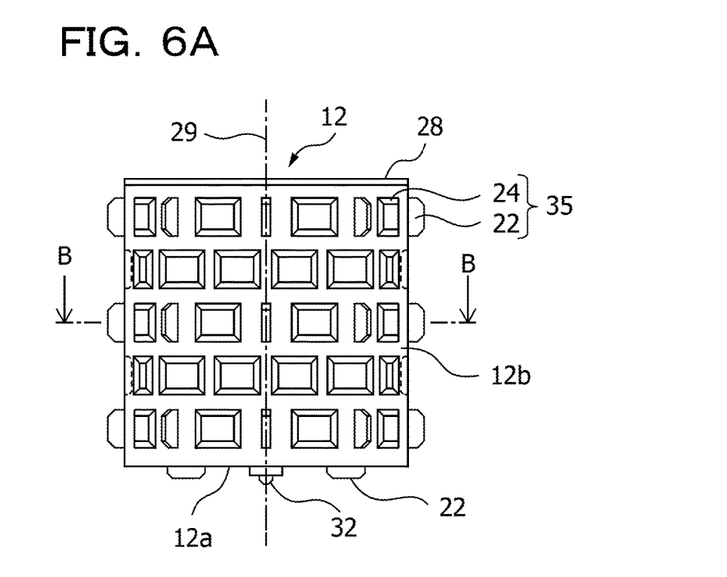
FIG. 6A is a side view of the immersion tank.
Figure 6B:
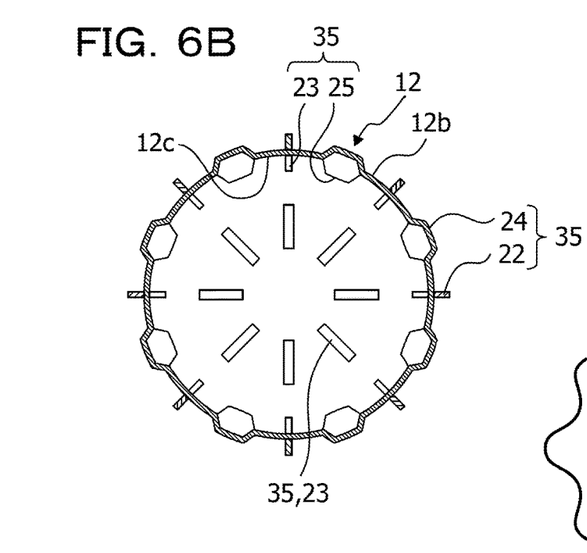
FIG. 6B is a sectional view of the immersion tank taken along an alternate long and short dash line B-B in FIG. 6A.

The immersion cooling apparatus 10 includes: an immersion tank cooling liquid 17 used to cool down the ICT devices 13; an immersion tank 12 in which the ICT devices 13 are disposed and the immersion tank cooling liquid 17 is stored; and the primary cooling system refrigerant 16 used to cool down the immersion tank 12. In addition, the immersion cooling apparatus 10 includes: a housing 11 in which the immersion tank 12 is disposed and the primary cooling system refrigerant 16 is stored; and a first driving mechanism 18 that rotates the immersion tank 12. Herein, the first driving mechanism 18 may be an example of a driver. The immersion tank 12 is disposed inside the housing 11 so as to be rotatable around an axis of rotation 29 extending vertically to the floor. The immersion tank 12 has an inner circumferential surface 12c and an outer circumferential surface 12b. As illustrated in FIGS. 6A and 6B, the inner circumferential surface 12c is positioned facing the ICT devices 13, and the outer circumferential surface 12b is positioned on the opposite side of the inner circumferential surface 12c. Each of the inner circumferential surface 12c and the outer circumferential surface 12b has a plurality of projections 35. The immersion tank cooling liquid 17, which may be an example of the secondary refrigerant, is cooled down by the primary cooling system refrigerant 16, which may be an example of the primary cooling system refrigerant.

As described above, the housing 11 is connected to the tiller 19 via the primary refrigerant pipe 30. Since the primary cooling system refrigerant 16 in the housing 11 warms up due to heat of the immersion tank 12, the primary cooling system refrigerant 16 is supplied from the housing 11 to the tiller 19. Then, the primary cooling system refrigerant 16 is cooled down by air blown by a compressor 20 in the tiller 19, so that the heat is removed from the primary cooling system refrigerant 16 and discharged to the outside in the direction denoted by an arrow A in FIGS. 3A and 3B. After cooled down by the tiller 19, the primary cooling system refrigerant 16 is returned from the tiller 19 to the housing 11 by the refrigerant pump 21 and reused to cool down the immersion tank 12. The compressor 20 may be disposed in a cooling tower instead of the tiller 19.

The immersion tank 12 in which the immersion tank cooling liquid 17 is stored may be made of a highly thermally conductive metal such as a stainless steel. The immersion tank 12 has a cylindrical shape and is rotatable around the axis of rotation 29. As illustrated in FIG. 3B, the immersion tank 12 is dipped into the primary cooling system refrigerant 16 stored in the housing 11.

The ICT devices 13 are held on mounting rails 14, and the mounting rails 14 are fixed to the housing 11. The ICT devices 13 are independent of the immersion tank 12. In other words, the ICT devices 13 stay stationary even when the immersion tank 12 rotates. Each ICT device 13 may be formed into a sheet shape having a large surface area, and its size may depend on its mounting site. For example, the ICT devices 13 may have different sizes and arranged side by side in the immersion tank 12, like the ICT devices 13a to 13c illustrated in FIG. 5A. This arrangement enables many ICT devices 13 to be disposed inside the immersion tank 12.

The immersion tank 12 is attached to the housing 11 so as to be rotatable around the axis of rotation 29 that is vertical to the floor. The immersion tank 12 is rotated by the first driving mechanism 18 provided near the immersion tank 12. By rotating the immersion tank 12, the immersion tank cooling liquid 17 in the immersion tank 12 is stirred and circulated around the axis of rotation 29. Simultaneously, part of the primary cooling system refrigerant 16 which is present around the immersion tank 12 is also stirred and circulated around the axis of rotation 29. In short, the rotation of the immersion tank 12 causes a warmed part of the primary cooling system refrigerant 16 to be mixed with a cooled part thereof. As a result, the entire primary cooling system refrigerant 16 is cooled down. Then, the primary cooling system refrigerant 16 cools down not only the immersion tank 12 but also the immersion tank cooling liquid 17 in the immersion tank 12. Simultaneously, the immersion tank cooling liquid 17 is circulated to cool down the ICT devices 13 disposed in the immersion tank 12. For this reason, the immersion cooling apparatus 10 configured above does not have to be provided with a pump that circulates the immersion tank cooling liquid 17 and a pipe through which the circulated immersion tank cooling liquid 17 flows.

The primary cooling system refrigerant 16 in the housing 11 which has been warmed up by the immersion tank cooling liquid 17 is supplied by the refrigerant pump 21 (see FIGS. 3A and 3B) to the tiller 19 via the primary refrigerant pipe 30, and then is cooled down by the compressor 20. The tiller 19 may be replaced with a cooling tower, such as the cooling tower 120 in the immersion cooling system 101 illustrated in FIG. 2. After cooled down, the primary cooling system refrigerant 16 is returned to the housing 11 and reused to cool down the immersion tank 12.

Figure 5A:
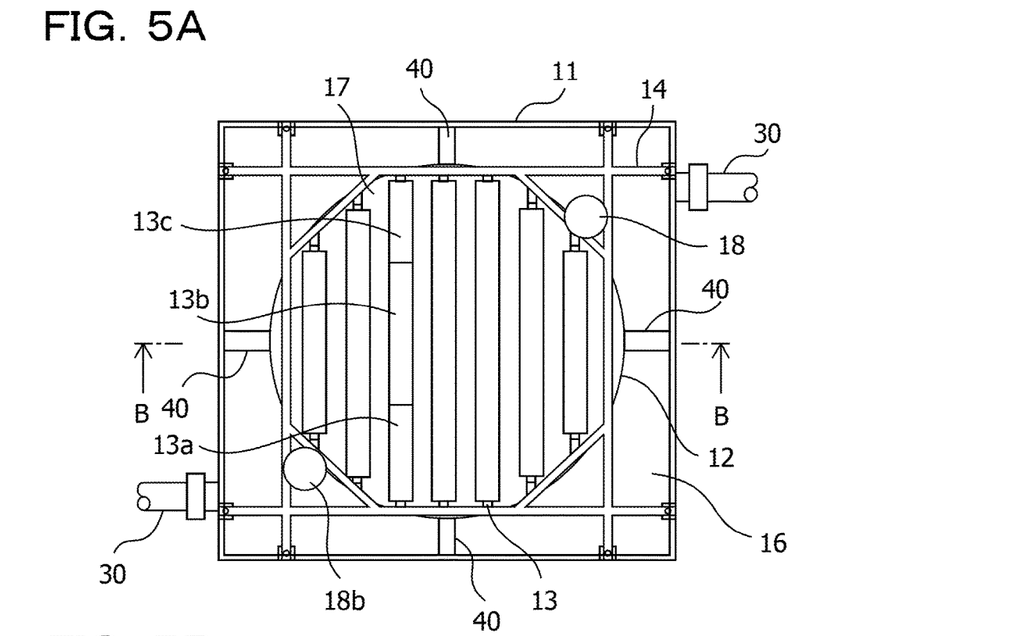
FIG. 5A is a top view of the immersion cooling apparatus with its lid raised.
Figure 5B:
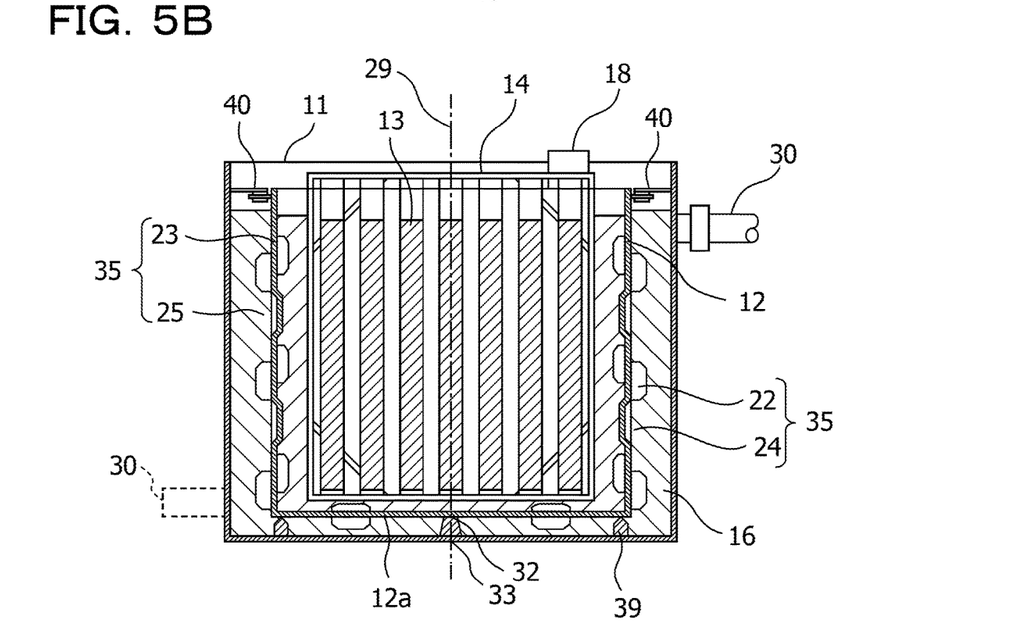
FIG. 5B is a sectional view of the immersion cooling apparatus taken along an alternate long and short dash line B-B in FIG. 5A.

As illustrated in FIG. 5B, the immersion tank 12 has a bottom 12a in which a rotating support shaft 32 is provided. The housing 11 includes a bearing 33 that receives the rotating support shaft 32 and rollers 39 near the bearing 33. The immersion tank 12 is rotatably supported at its four upper locations by respective support parts 40 on the top of the housing 11.

The housing 11, which accommodates the immersion tank 12, has a lid 31 on its upper surface. A user is able to open the housing 11 by getting his/her finger caught in a knob 37 and moving the lid 31 in the direction denoted by an arrow C in FIG. 4C. When the housing 11 is open, the lid 31 is still fixed to the housing 11 by a fixing support member 38. The housing 11 has two installation legs 34 on its bottom, and the installation legs 34 support the housing 11 from the bottom. Furthermore, the housing 11 has a cable hole 41 in its side surface, and cables connected to the ICT devices 13 are extended to the outside via the cable hole 41.

As illustrated in FIGS. 6A and 6B, the inner circumferential surface 12c of the immersion tank 12, which is a surface facing the ICT devices 13, is provided with a plurality of projections 35. Likewise, the outer circumferential surface 12b of the immersion tank 12, which is a surface on the opposite side of the inner circumferential surface 12c, is provided with a plurality of projections 35. When the first driving mechanism 18 rotates the immersion tank 12, the projections 35 on the inner circumferential surface 12c stir and circulates the immersion tank cooling liquid 17 in the immersion tank 12 around the axis of rotation 29. Simultaneously, the projections 35 on the outer circumferential surface 12b stir and circulate the primary cooling system refrigerant 16 outside the immersion tank 12 around the axis of rotation 29.

Some of the projections 35 on the outer circumferential surface 12b of the immersion tank 12 may be a plurality of first agitating fins 22, for example, that protrude outward, namely, in the direction away from the ICT devices 13. The first agitating fins 22 may have a flat part and be an example of fins. Likewise, some of the projections 35 on the inner circumferential surface 12c of the immersion tank 12 may be a plurality of second agitating fins 23, for example, that protrude inward, namely, in the direction toward the ICT devices 13. The second agitating fins 23 may have a flat part and be another example of the fins. Each of the first agitating fins 22 on the outer circumferential surface 12b and the second agitating fins 23 on the inner circumferential surface 12c has a long side parallel to the axis of rotation 29. As illustrated in FIG. 6B, the first agitating fins 22 on the outer circumferential surface 12b may be spaced in an equiangular manner. Likewise, the second agitating fins 23 on the inner circumferential surface 12c may be spaced in an equiangular manner. For example, the angles between the individual first agitating fins 22 and the angles between the individual second agitating fins 23 may be set to 45 degrees, as illustrated in FIG. 6B. Alternatively, the angles may be set to 30 or 60 degrees. Some of the first agitating fins 22 may be arrayed in parallel to the axis of rotation 29. Likewise, some of the second agitating fins 23 may be arrayed in parallel to the axis of rotation 29. As illustrated in FIG. 6A, for example, three first agitating fins 22 may be arrayed vertically, and three second agitating fins 23 may be arrayed vertically. Alternatively, two or four or more first agitating fins 22 may be arrayed vertically, and two or four or more second agitating fins 23 may be arrayed vertically. By providing the first agitating fins 22 and the second agitating fins 23 in this manner, both the primary cooling system refrigerant 16 and the immersion tank cooling liquid 17 are stirred strongly.

In addition to the inner circumferential surface 12c and the outer circumferential surface 12b of the immersion tank 12, the first agitating fins 22 and the second agitating fins 23 are formed on the bottom 12a. As illustrated in FIG. 6B, the first agitating fins 22 and the second agitating fins 23 are formed on the bottom 12a such that their long sides are arranged radially from the axis of rotation 29. By further providing the projections 35 on the bottom 12a in this manner, not only parts of the primary cooling system refrigerant 16 and the immersion tank cooling liquid 17 which are present near the periphery of the immersion tank 12 but also the parts near the axis of rotation 29 are stirred and circulated.

Figure 6C:
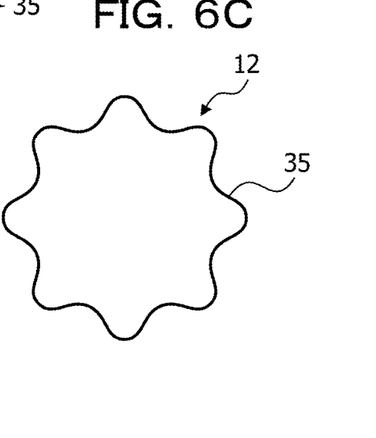
FIG. 6C is a sectional view of another example of the immersion tank.

As illustrated in FIG. 6B, some of the projections 35 on the outer circumferential surface 12b may be a plurality of first swelling parts 24, for example, each of which has sides swelling outward. Likewise, some of the projection 35 on the inner circumferential surface 12c may be a plurality of second swelling parts 25, for example, each of which has sides swelling inward. Providing the first swelling parts 24 and the second swelling parts 25 as in FIG. 6B, the outer circumferential surface 12b and the inner circumferential surface 12c are formed unevenly. In other words, the surface areas of the outer circumferential surface 12b and the inner circumferential surface 12c are increased. The immersion tank 12 structured in this manner makes it possible to transfer its heat to the primary cooling system refrigerant 16 at a higher rate. Alternatively, as illustrated in FIG. 6C, the projections 35 of the immersion tank 12 may be created by forming the outer circumferential surface 12b and the inner circumferential surface 12c in a wavy fashion.

Figure 7A:
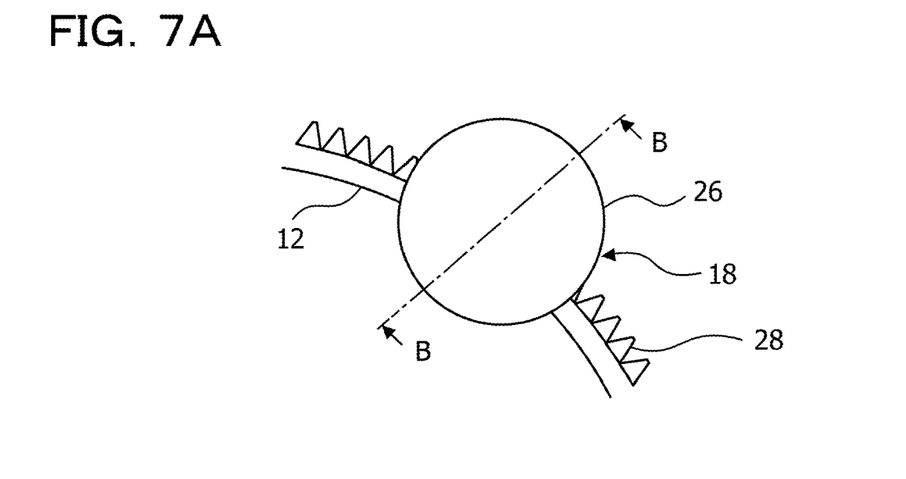
FIG. 7A is an enlarged view of the driving mechanism in the immersion tank.
Figure 7B:
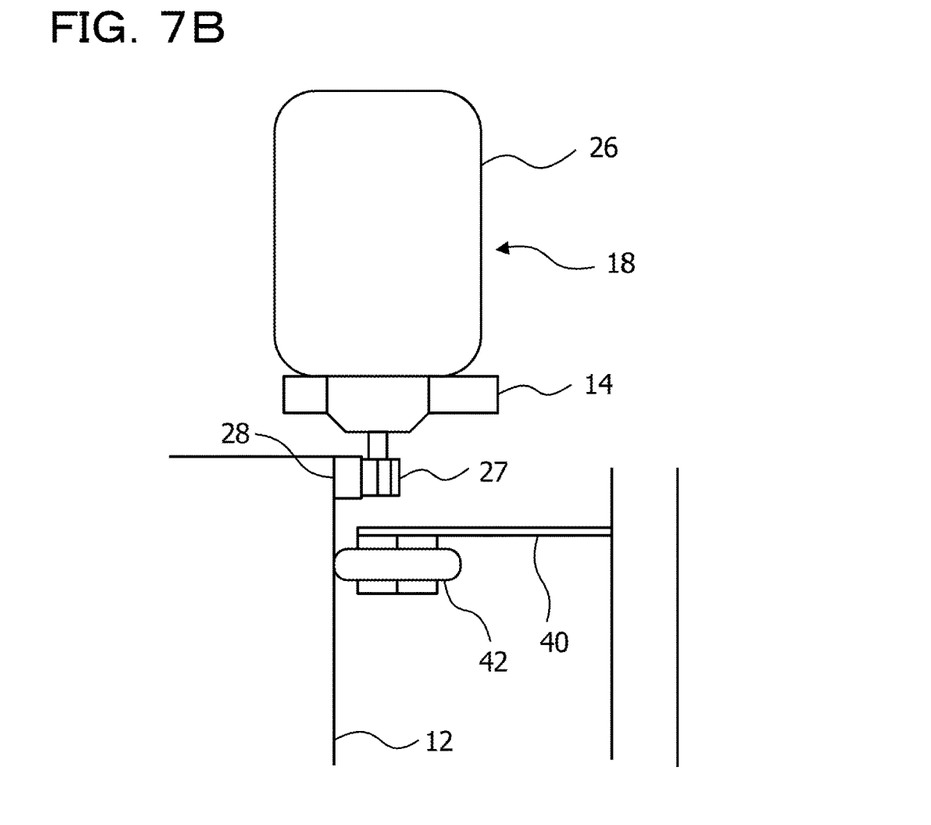
FIG. 7B is a sectional view of the driving mechanism taken along an alternate long and short dash line B-B in FIG. 7A.

As illustrated in FIGS. 7A and 7B, the first driving mechanism 18 includes: a motor 26; and a gear 27 coupled to the motor 26. The immersion tank 12 has a rotary gear 28 on the outer circumferential surface 12b. The gear 27 of the first driving mechanism 18 engages with the rotary gear 28, allowing the motor 26 to rotate the immersion tank 12. The first driving mechanism 18 is supported by one or more of the mounting rails 14 on which the ICT devices 13 are held. As described above, the housing 11 is provided with the support parts 40 that support the immersion tank 12. Each support part 40 has a rotatable support roller 42, which abuts against the outer circumferential surface 12b of the immersion tank 12. In this way, the support parts 40 rotatably support the immersion tank 12.

In addition to the above first driving mechanism 18, the immersion cooling apparatus 10 may include a second driving mechanism 18b, as illustrated in FIGS. 4A to 5A. By providing both the first driving mechanism 18 and the second driving mechanism 18b, one of the first driving mechanism 18 and the second driving mechanism 18b successfully rotates the immersion tank 12 even if the other fails to operate properly. If a redundant function is applied to the first comparative technique in FIG. 1 or the second comparative technique in FIG. 2, additional pipes and pumps have to be provided in the immersion cooling system 101 or 201. In the immersion cooling apparatus 10, however, the second driving mechanism 18b successfully fulfils the redundant function. Thus, to apply the redundant function to the immersion cooling apparatus 10, an additional driving mechanism is simply provided. Therefore, it is possible to easily enhance reliability and safety of the immersion cooling apparatus 10 at a relatively low cost.

The heat of the immersion tank 12 is directly transferred to the primary cooling system refrigerant 16 in the housing 11, so that the primary cooling system refrigerant 16 warms up. In this case, a rate at which the primary cooling system refrigerant 16 warms up depends on its volume. Thus, by varying the volume of the primary cooling system refrigerant 16 in the housing 11, a period over which the primary cooling system refrigerant 16 warms up may be adjusted. Consequently, it is possible to keep the immersion tank 12 cool over a preset period even when a device that supplies the primary cooling system refrigerant 16, such as the refrigerant pump 21, fails to operate.

Next, a description will be given below of respective cooling keeping periods of the immersion cooling system 101 in the first comparative technique illustrated in FIG. 1 and the immersion cooling system 1 illustrated in FIG. 3. The term "cooling keeping period" refers to a period over which ICT devices are kept cool in an immersion tank. One sample of the immersion cooling system 101 and four samples of the immersion cooling system 1 were prepared, and their cooling keeping periods were measured and compared. In the samples of the immersion cooling system 1, the housings 11 had the same height, but their widths were different from one another. More specifically, their height was set to 0.75 meters and their widths were set to 1.0, 1.2, 1.4, and 1.6 meters. For the sample of the immersion cooling system 101, after the immersion tank cooling liquid pump 121 was stopped, a period over which an inner temperature of the immersion tank 112 rose from 35 to 40 degrees Centigrade was measured. For each sample of the immersion cooling system 1, after the flow of the primary cooling system refrigerant 16 was stopped, a period over which an inner temperature of the immersion tank 12 rose from 35 to 40 degrees Centigrade was measured.

(1) Comparative technique: configuration of immersion cooling system 101
  size of immersion tank 112
  width: 0.6 meters
  depth: 0.75 meters
  liquid height: 0.9 meters
  total volume of ICT devices 113 in immersion tank 112: 96 liters (2) Embodiment: configuration of immersion cooling system 1
  size of immersion tank 12
  diameter: 0.75 meters
  liquid height: 0.9 meters
  total volume of ICT devices 13 in immersion tank 12: 96 liters
  sizes of housing 11 (primary cooling tank)
  width: 1.0, 1.2, 1.4, and 1.6 meters
  depth: 0.75 meters
  liquid height 0.9 meters

TABLE 1

| POWER OF ICT DEVICE IN IMMERSION TANK [kW] | COMPARISON TECHNOLOGY TIME (min) | PRIMARY COOLING TANK WIDTH 1.0 m | | PRIMARY COOLING TANK WIDTH 1.2 m | | PRIMARY COOLING TANK WIDTH 1.4 m | | PRIMARY COOLING TANK WIDTH 1.6 m | |
|---|---|---|---|---|---|---|---|---|---|
| | | TIME (min) | RATIO WITH COMPARISON TECHNOLOGY | TIME (min) | RATIO WITH COMPARISON TECHNOLOGY | TIME (min) | RATIO WITH COMPARISON TECHNOLOGY | TIME (min) | RATIO WITH COMPARISON TECHNOLOGY |
| 20 | 2.5 | 12 | 4.7 | 15.2 | 6 | 18.5 | 7.3 | 21.8 | 8.6 |

Table 1 reveals that all the samples of the immersion cooling system 1 exhibit longer cooling keeping periods than that of the sample of the immersion cooling system 101. In addition, the cooling keeping period of each sample of the immersion cooling system 1 depends on the size, such as the width, of the housing 11 in which the primary cooling system refrigerant 16 is stored.

For the immersion cooling system 101 and the immersion cooling system 1, power consumptions were measured, and then cooling efficiencies were determined based on the power consumptions and compared. Table 2 indicates that total power consumptions and power usage effectiveness (PUE) values of data centers in which the immersion cooling system 101 and the immersion cooling system 1 are installed. Each PUE value is determined by (power consumed by ICT devices/total power consumption); total power consumption is the sum of the power consumed to cool the ICT devices and the power consumed by the ICT devices. Table 2 reveals that the total power consumed by the immersion cooling system 1 is lower than that consumed by the immersion cooling system 101 by approximately 1.4 kW (6%). In addition, the PUE value of the immersion cooling system 1 is lower than that of the immersion cooling system 101 by approximately 0.07. Thus, Table 2 demonstrates that the immersion cooling system 1 improves the power consumption and the cooling efficiency.

TABLE 2

| | IMMERSION COOLING SYSTEM 101 IN COMPARISON TECHNOLOGY | IMMERSION COOLING SYSTEM 1 IN EMBODIMENT |
|---|---|---|
| POWER OF ICT DEVICE IN IMMERSION TANK [kW] | 20 | 20 |
| TOTAL POWER OF COOLING SYSTEM [kW] | 2.25 | 0.85 |
| COOLING LIQUID PUMP IN COMPARATIVE TECHNOLOGY | 1.5 | — |
| DRIVING MECHANISM (MOTOR) FOR ROTATING IMMERSION TANK IN EMBODIMENT | — | 0.1 |
| COOLING TOWER | 0.75 | 0.75 |

TABLE 2-continued

| | IMMERSION COOLING SYSTEM 101 IN COMPARISON TECHNOLOGY | IMMERSION COOLING SYSTEM 1 IN EMBODIMENT |
|---|---|---|
| TOTAL POWER [kW] | 22.25 | 20.85 |
| REDUCTION IN TOTAL POWER RELATIVE TO COMPARISON TECHNOLOGY | | 1.4-6% |
| PUE | 1.387 | 1.043 |
| IMPROVEMENT IN PUE RELATIVE TO COMPARISON TECHNOLOGY | | 0.07 |

According to the immersion cooling apparatus 10 described above, the primary cooling system refrigerant 16 directly cools down the immersion tank 12. Therefore, the immersion cooling apparatus 10 does not have to be provided with a pump used to circulate the immersion tank cooling liquid 17. The immersion tank 12 rotates inside the primary cooling system refrigerant 16, thereby stirring and circulating both the primary cooling system refrigerant 16 and the immersion tank cooling liquid 17. During the rotation, heat of the immersion tank cooling liquid 17 is transferred to the primary cooling system refrigerant 16. The ICT devices 13 inside the immersion tank 12 are thereby cooled down. The immersion cooling apparatus 10 does not include an immersion tank cooling liquid pump, a cooling tower, a heat exchanger, a pipe, and other components dedicated for the immersion tank cooling liquid 17. Therefore, it is possible to install the immersion cooling apparatus 10 without incurring a cost increase.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An immersion cooling apparatus comprising:
   an immersion tank in which an electronic device is disposed and in which a secondary refrigerant is stored, the electronic device being dipped into and cooled down by the secondary refrigerant;
   a housing in which the immersion tank is disposed and in which a primary refrigerant is stored, the immersion tank being dipped into and cooled down by the primary refrigerant; and
   a driver that rotates the immersion tank, wherein
   the immersion tank being rotatably attached to an interior of the housing,
   the immersion tank having an inner circumferential surface and an outer circumferential surface, the inner circumferential surface being positioned facing the electronic device, the outer circumferential surface being positioned on an opposite side of the inner circumferential surface, each of the inner circumferential surface and the outer circumferential surface having a plurality of projections.

2. The immersion cooling apparatus according to claim 1, wherein
   the projections include a plurality of fins that stir the primary refrigerant and the secondary refrigerant, each of the fins having a flat part.

3. The immersion cooling apparatus according to claim 1, wherein
   the projections include a plurality of swelling parts formed such that parts of the immersion tank swell in a direction toward or away from the electronic device.

4. The immersion cooling apparatus according to claim 1, wherein
   the immersion tank has a cylindrical shape that is symmetric with respect to an axis of rotation of the immersion tank, and
   the projections include a plurality of projections arranged on a bottom of the immersion tank in a radial fashion from the axis of rotation.

5. The immersion cooling apparatus according to claim 1, wherein
   the secondary refrigerant has a lower electric conductivity than that of the primary refrigerant.

* * * * *